April 10, 1962 R. O. MAZE 3,029,337
CRYSTAL CONTROLLED CONVERTER
Filed Nov. 14, 1957
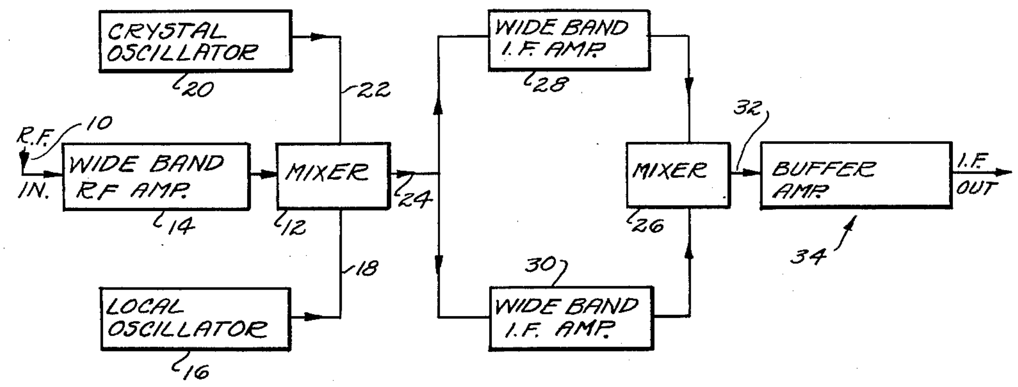
INVENTOR.
ROBERT O. MAZE
BY Wade Koontz AND S. A. Stickler
ATTORNEYS United States Patent Office 3,029,337
Patented Apr. 10, 1962

3,029,337
CRYSTAL CONTROLLED CONVERTER

Robert O. Maze, Roseville, Minn., assignor to the United States of America as represented by the Secretary of the Air Force Filed Nov. 14, 1957, Ser. No. 696,581
3 Claims. (Cl. 250—20)

This invention relates to a crystal controlled frequency converter and particularly to a converter for removing frequency variations or modulation from an amplitude modulated signal.

In the utilization of superheterodyne receivers considerable difficulty has been encountered because instability of either the carrier frequency or the local oscillator produces frequency modulated components in the amplitude modulated intermediate frequency. In order to eliminate this undesirable modulation it has been found necessary to provide oscillators having a high degree of stability both for transmitting and for local receiver oscillators. Also, it has been necessary to utilize variable tuned circuits for radio-frequency amplification. Both these causes result in bulky, complex and expensive receivers and transmitters.

The present invention provides a circuit utilizing a simple crystal controlled oscillator together with a series of identical fixed-tuned stages to effectively remove frequency-modulated components from amplitude modulated signals and thus permit the use of simple, light and inexpensive receivers and/or transmitters. The circuit provides a simple very compact converter adaptable to very wide band frequency use. The circuit is particularly suitable for secure communications systems, as well as data link and telemeter type radio receivers and transmitters.

In the construction according to the invention a non-linear triple mixer is fed from a signal source which may have variable frequency characteristics and the outputs of a pair of oscillators one of which is crystal controlled. The triple mixer produces a plurality of output frequencies at least two of which are impressed on a second mixer the output of which is preferably crystal controlled. All circuit elements are fixed-tuned wide band components.

It is an object of the invention to provide an improved crystal controlled converter.

It is another object of the invention to provide a converter operative to remove frequency-modulated components from amplitude modulated signals.

It is a still further object of the invention to provide a converter allowing reception of the modulation of a simplified transmitter, with an ordinary narrow band receiver without distortion because of frequency modulation of the transmitter.

It is a further object of the invention to provide a converter adaptable to very wide band frequency without variable tuned radio frequency amplification.

It is still another object of the invention to provide a converter utilizing a series of identical fixed-tuned stages.

It is yet another object to provide a converter substantially less susceptable to jamming.

It is a still further object of the invention to provide a converter that does not require a high stability local oscillator.

Other objects and advantages of the invention will be apparent from the following detailed description taken in conjunction with the accompanying drawing in which the single FIGURE is a diagrammatic illustration of a crystal controlled converter according to the invention.

In an exemplary construction according to the invention a radio frequency signal input circuit such as an antenna 10 receives an amplitude modulated signal from any source such as a simple transmitter, or a relatively unstable frequency carrier, or a frequency affected by a jamming signal.

The input signal from circuit 10 is fed to a tube or other non-linear triple mixer 12, preferably through a wide band fixed-tuned radio frequency amplifier 14.

A local oscillator 16 which may be a simple oscillator has its output impressed on the triple mixer 12 by local supply circuit 18. Likewise, a crystal controlled or fixed frequency oscillator 20 has its output impressed on mixer 12. The triple mixer 12 then provides a plurality of intermediate frequencies at its output terminal 24.

Two of the intermediate frequencies appearing at output terminal 24 are applied to a second mixer 26 by a first fixed-tuned wide band intermediate frequency amplifier 28 for transferring a first output frequency from the triple mixer 12 to the second mixer 26 and a second fixed-tuned wide band intermediate frequency amplifier 30 for transferring a second output frequency from the triple mixer 12 to the second mixer 26.

The stabilized intermediate frequency appears at output terminal 32 and may be supplied directly to the utilizing device such as the detector of a receiver. However, it is frequently desirable to feed out through a buffer amplifier 34 which is crystal controlled, preferably at a harmonic of the frequency of the crystal oscillator 20.

In the operation of the converter, a signal from any source such as a simple transmitter such as a modulated oscillator, as found in a telemetering sender, is received at the input circuit 10 and if necessary amplified by the fixed-tuned wide band radio frequency amplifier 14 and fed to the triple mixer 12 together with the output frequency waves of the local oscillator 16 and the crystal controlled oscillator 20. The triple mixer 12 produces a plurality of frequencies which carry the amplitude modulation of the incoming signal. Any two of those whose difference is fixed by the crystal frequency or by multiples of the crystal frequency may be chosen for the intermediate frequency. For example, suitable frequencies are first (signal frequency minus local oscillator frequency) and second (signal frequency minus local oscillator frequency minus crystal frequency).

The double intermediate frequency stages 28 and 30 which form the link of the converter must be of sufficiently broad band width to accommodate changes in signal frequency or local oscillator frequency. These stages 28 and 30 must have sufficient gain or shielding to raise their level above the level of the leakage from the crystal oscillator.

The outputs of the stages 28 and 30 are fed into the second mixer 26 which provides the output intermediate frequency. The output of the second mixer 26 is fed to the buffer amplifier operating at the crystal frequency, or some multiple of the crystal frequency. The buffer amplifier is optional and may be omitted in certain applications. A low frequency oscillator may be used instead of a crystal where low cost is important, thereby gaining the stability of a low frequency oscillator on a VHF or UHF system.

For purpose of exemplification a particular embodiment of the invention has been shown and described according to the best present understanding thereof, however, it will be apparent to those skilled in the art that many changes and modifications in the construction and arrangement of the parts thereof may be resorted to without departing from the true spirit of the invention.

What I claim is:

1. A crystal controlled frequency converter comprising a crystal controlled oscillator, a local oscillator, a source of amplitude modulated signals, a non-linear triple mixer, means for applying signals from said source to said triple mixer, means for applying the outputs of said oscillators on said triple mixer, a second mixer, a first wide band intermediate frequency amplifier for transferring a first output frequency from said triple mixer to said second mixer, a second wide band intermediate frequency amplifier connected for transferring a second output frequency from said triple mixer to said second mixer.

2. A controlled frequency converter comprising a stabilized oscillator, a local oscillator, an input circuit supplying amplitude modulated signals, a non-linear triple mixer, a radio frequency amplifier connected to said input circuit, connections for impressing the signals from said radio frequency amplifier and the outputs of said oscillators on said triple mixer, a second mixer, a first wide band intermediate frequency amplifier for transferring a first output frequency from said triple mixer to said second mixer, a second wide band intermediate frequency amplifier connected for transferring a second output frequency from said triple mixer to said second mixer.

3. A crystal controlled frequency converter for stabilizing an unstable frequency signal comprising a non-linear triple mixer, a crystal controlled oscillator, a local oscillator, connections for applying said signal and the outputs of said oscillators to said triple mixer, a second mixer, a plurality of intermediate frequency amplifiers connected between said triple mixer and said second mixer and an output amplifier connected to the output of said second mixer, said output amplifier operating at a preselected harmonic of said crystal oscillator.

References Cited in the file of this patent

UNITED STATES PATENTS

| | | |
|---|---|---|
| 2,509,963 | Collins | May 30, 1950 |
| 2,558,790 | Smith | July 3, 1951 |
| 2,606,285 | Bataille et al. | Aug. 5, 1952 |
| 2,647,992 | Dome | Aug. 4, 1953 |
| 2,813,974 | Keall | Nov. 19, 1957 |